United States Patent
Boemmels et al.

(10) Patent No.: US 10,748,815 B2
(45) Date of Patent: Aug. 18, 2020

(54) THREE-DIMENSIONAL SEMICONDUCTOR DEVICE AND METHOD OF MANUFACTURING SAME

(71) Applicant: IMEC vzw, Leuven (BE)

(72) Inventors: Juergen Boemmels, Heverlee (BE); Julien Ryckaert, Schaerbeek (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/663,796

(22) Filed: Oct. 25, 2019

(65) Prior Publication Data

US 2020/0135568 A1  Apr. 30, 2020

(30) Foreign Application Priority Data

Oct. 26, 2018 (EP) ..................................... 18202739

(51) Int. Cl.
*H01L 21/8234* (2006.01)
*H01L 29/423* (2006.01)

(52) U.S. Cl.
CPC ........... *H01L 21/823412* (2013.01); *H01L 21/823437* (2013.01); *H01L 21/823468* (2013.01); *H01L 21/823481* (2013.01); *H01L 29/42392* (2013.01)

(58) Field of Classification Search
None
See application file for complete search history.

(56) References Cited

U.S. PATENT DOCUMENTS

| | | |
|---|---|---|
| 9,502,518 B2 * | 11/2016 | Liu ................... H01L 29/42364 |
| 9,773,886 B1 | 9/2017 | Palle et al. |
| 9,799,748 B1 | 10/2017 | Zie et al. |
| 9,831,323 B2 | 11/2017 | Kittl et al. |
| 9,923,055 B1 | 3/2018 | Cheng et al. |
| 9,954,058 B1 | 4/2018 | Mochizuki et al. |
| 9,972,542 B1 | 5/2018 | Bi et al. |
| 9,978,833 B2 | 5/2018 | Kittl et al. |
| 2010/0207208 A1 | 8/2010 | Bedell et al. |
| 2015/0372104 A1 | 12/2015 | Liu et al. |
| 2017/0222024 A1 | 8/2017 | Bergendahl et al. |
| 2018/0047835 A1 | 2/2018 | Chao et al. |
| 2018/0061955 A1 | 3/2018 | Gaben |
| 2018/0114834 A1 | 4/2018 | Cheng et al. |

OTHER PUBLICATIONS

European Extended Search Report, re Application No. 18202739.1-1212, dated Apr. 8, 2019.

* cited by examiner

*Primary Examiner* — Jack S Chen
(74) *Attorney, Agent, or Firm* — Knobbe Martens Olson & Bear, LLP (57) ABSTRACT

The present disclosure relates to three dimensional (3D) transistor structures and methods of forming the same. In an aspect, a method comprises providing a vertical stack of alternating layers of channel material and dummy material, forming a first set of fins on the stack, and forming a second fin above the first set of fins, the second fin extending orthogonal to the first set of fins. Further, the first set of fins is cut into a set of fin portions, using the second fin and a first sidewall spacers as an etch mask, and second sidewall spacers are formed on the second fin. These structures are used to form a 3D structure of channel regions and source/drain regions forming transistor structures. Advantageously, the 3D semiconductor structure is manufactured using a relatively low number of mask layers per transistor which decreases manufacturing costs.

15 Claims, 10 Drawing Sheets

THREE-DIMENSIONAL SEMICONDUCTOR DEVICE AND METHOD OF MANUFACTURING SAME

CROSS-REFERENCE TO RELATED APPLICATIONS

This application claims foreign priority to European Application No. EP 18202739.1, filed on Oct. 26, 2018, the content of which is incorporated by reference herein in its entirety.

BACKGROUND

Field

The disclosed technology generally relates to the field of semiconductor devices, and more particularly to a three-dimensional (3D) semiconductor device and methods of manufacturing the same.

Description of the Related Technology

Consumers increasingly demand electronic products having semiconductor devices that are highly integrated for superior performance while remaining relatively inexpensive. Some of the consumer demands may be addressed with continued physical scaling of the semiconductor devices and increase in the density of the semiconductor devices. In some semiconductor devices, e.g., two-dimensional (2D) or planar semiconductor device, the integration (density) of the device mainly corresponds to the lateral dimensions or the area occupied by a unit cell of the device. With continued scaling to achieve increasingly smaller devices, however, such lateral scaling may eventually become impractical or insufficient to meet the technological needs. This may be because, among other reasons, as the technological node advances, smaller sizes may be achieved at the expense of increasing difficulty and/or cost. To overcome the potential roadblock for continued increase in the device density, three-dimensional (3D) semiconductor devices having vertically arranged cells have recently been proposed.

The scaling of vertical 3D semiconductor devices is mainly based on the increase of the number of layers of each cell in order to provide a high density and a low footprint. However, in fabrication of 3D semiconductor devices, various problems may occur due to the structural configuration of the devices. Consequently, one disadvantage of 3D semiconductor devices compared with planar (2D) semiconductor is that the manufacturing cost often is higher. A simpler manufacturing process for 3D semiconductor devices would thus be advantageous.

SUMMARY OF CERTAIN INVENTIVE ASPECTS

An objective of the present disclosure is to achieve a simplified manufacturing process of 3D semiconductor devices.

The present disclosure provides a method for forming a plurality of three-dimensionally arranged transistor structures, by means of an etch mask formed by a first set of fins and a second set of fins with sidewall spacers. More specifically, the method includes: providing a vertical stack of alternating layers of a channel material and a dummy material; forming a first set of fins on the stack; forming a second fin and sidewall spacers above the first set of fins, the second fin and sidewall spacers extending orthogonal to the first set of fins; cutting the first set of fins into a set of fin portions, using the second fin as an etch mask; forming a plurality of sidewall spacers on the second fin; forming a column of the stack of alternating layers by using the second fin and sidewall spacers as an etch mask; etching through the stack of alternating layers by using the set of fin portions, the sacrificial material, the second fin and the sidewall spacers as an etch mask, wherein each fin portion defines a vertical set of channel regions in the column, and wherein the sidewall spacers define the source/drain regions associated with each channel region; and removing the dummy material between the channel regions of each vertical set of channel regions, thereby forming wires suspended between their respective source/drain regions.

The disclosed technology includes a process in which the pattern formed by the first set of fins, which are cut into a set of fin portions, is etched from the mask layer formed by the second set of fins and their associated sidewall spacers. In this way a mask structure can be provided from the initially formed sets of fins, and used to pattern different features throughout the processing of the 3D structure. This allows for a 3D semiconductor structure to be formed with a relatively low number of mask layers per transistor, particularly compared to prior art techniques in which each layer is pattern with its own mask.

The disclosed technology further provides for the transistor structures to be accessed and processed from two different directions—a first direction during the forming of the column by means of the second fins and sidewall spacers, and a second direction when the stack is etched through by using the set of fin portions from the first set of fins. Hence, the initially formed mask structure of the set of fin portions, the second fin and the sidewall spacers can be used to access and process the channel region and source/drain regions of the transistor structures both from the length direction of the channel region and the lateral width direction of the channel region.

As used herein, the term "layer" refers to a material portion including a region having a thickness. A layer may extend over the entirety of an underlying or overlying structure, or may have an extent less than the extent of an underlying or overlying structure. Further, a layer may refer to a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

The term "vertical stack" refers to a structure comprising at least two layers arranged on top of each other, as seen in a vertical direction relative an underlying semiconductor substrate. The stack may be arranged such that every second layer is formed of the channel material and interleaved with the dummy material. The dummy material layers may be considered as placeholders or sacrificial layers, since they are intended to be removed during the manufacturing process.

Generally, the term "fin" refers to a feature having a top surface and two opposing sidewalls that protrude from the underlying material. A fin may be formed by means of multi patterning schemes such as self-aligned double patterning (SADP) or self-aligned quadruple patterning (SAQP). The fins may further be provided with sidewall spacers, which may be understood as spacer material that is deposited on or at one or both of the sidewalls of the fin.

The term "wire" refers to a structure that during the manufacturing process is released from the surrounding material supporting the structure in a vertical direction, and that can be employed as a channel in the finished transistor structure. Depending on the selected manufacturing process, the wire can have a length direction along a direction of the current flow in the channel of the transistor, and a cross section across the same for example being circular, oval or polygonal.

In some embodiments, the second fin may form part of a second set of fins, each of which have sidewall spacers. The second set of fins and corresponding sidewall spacers may be used as an etch mask for forming a plurality of columns. Thus, it is appreciated that the method according to the present disclosure is not limited to the formation of a single column, but can easily be employed for the manufacturing of 3D devices having a plurality of columns, wherein each column comprises a plurality of vertical sets of transistor structures. The number of columns may be defined by the number fins of the second set of fins, whereas the number of vertical sets of transistor structures of each column may be determined by the number of fins of the first set of fins, extending orthogonal to the fins of the second set of fins.

In some embodiments, the step of forming the first set of fins may further include forming the sidewall spacers on each fin of the first set of fins. Forming sidewall spacers may be followed by filling between sidewall spacers on adjacent fins of the first set of fins with the sacrificial material. The resulting structure, i.e. the first set of fins, the sidewall spacers on the first set of fins and the sacrificial material, may then be planarized prior to forming the second fin. Consequently, the second fin (or second set of fins) may be formed directly on the first set of fins, such that the upper surface of the fins of the first set of fins shares an interface with a bottom surface of the second fin. Alternatively, an additional material or layer may be arranged between the first set of fins and the second fin, such that the second fin is formed above, rather than directly on the first set of fins.

In some embodiments, forming the column may be followed by a process in which lateral recesses are formed in the dummy material of the vertical stack and provided with a dielectric material. Recessing to create lateral recesses may be performed by etching the dummy layer laterally, with selectivity to the channel material, and preferably to a depth that is slightly less than the width of the sidewall spacers to allow the material of the dummy layer to be replaced by a dielectric material forming a permanent isolator. This is of particular relevance when using dummy materials that are not isolators, such as SiGe which is known to be a semiconductor material and thus less suitable for isolating purposes. The dielectric material may for example be an oxide, such as silicon dioxide, deposited in a selective deposition process. Alternatively, the dielectric may be provided by means of conformal deposition followed by an anisotropic etch that is selective to the sidewall spacer. The dielectric may provide an isolation between the different channels of the transistor devices, and may advantageously present a low leakage current and preferably a low capacitance.

In some embodiments, the step of etching through the stack of alternating layers may be followed by a process in which lateral recesses are formed in the channel material. The depth of the recesses may correspond to the width of the first sidewall spacers, and the etch process may be an isotropic etch also recessing the channel material under the sidewall spacers of the second fin. Preferably, the etch process may be uniform between the dummy material and the channel material, and selective to the dielectric material previously provided in the dummy material. The recesses in the channel material may define the isolation distance between the source/drain contacts and the gate contact in the resulting transistor.

In a subsequent step, an isolating spacer material may be formed in the recesses in the channel material. This may be followed by an etch process for selectively removing the isolating spacer material from the channel material, leaving the isolating spacer material in the recesses formed at the source/drain regions under the sidewall spacers of the second fin. Preferably, the sidewall spacers on the first set of fins and the isolating spacer may be formed of the same material, which allows them to be removed in the same etch process. The isolating spacer material may be selected based on its dielectric properties, such as dielectric constant k and breakdown voltage, in order to achieve a preferred isolation between the source/drain regions and the gate stack material (which may be deposited on the channel regions and the isolating spacer material in subsequent processing steps).

In some embodiments, the material of the sidewall spacers on the first set of fins may be etch selective with respect to the material of the sidewall spacers on the second set of fins. This allows for the sidewall spacers to be selectively used as an etch mask for different steps in the manufacturing of the 3D structure without the need of any additional, protective masks.

In some embodiments, the method of forming a plurality of transistor structures, arranged in a 3D structure, may further comprise a process for forming a gate stack. The gate stack may be arranged to surround or enclose the released wire forming the channel region of the final transistor structure. The stack may for example be formed of a dielectric material such as a high-dielectric material combined with one or several metal layers. The dielectric material may act as the gate dielectric and the one or several metal layers may act as the gate of the transistors.

In some embodiments, the channel material may be formed of Si and the dummy material of SiGe. Further, the first set of fins may be formed of SiN, the first sidewall spacers may be formed of SiCO, and the sacrificial material between first sidewall spacers on adjacent fins of the first set of fins of $SiO_2$. Preferably, the selected materials are etch selective relative each other. Examples of etch selective dielectrics include $SiN/SiCO/SiO_2$.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise. As illustrated in the figures, the sizes of layers and regions may be exaggerated for illustrative purposes and, thus, may be provided to illustrate the general structures of embodiments of the present invention.

DETAILED DESCRIPTION OF CERTAIN ILLUSTRATIVE EMBODIMENTS

Embodiments of a manufacturing process of a three-dimensional (3D) semiconductor device will now be described using FIGS. 1-20.

Figure 1:
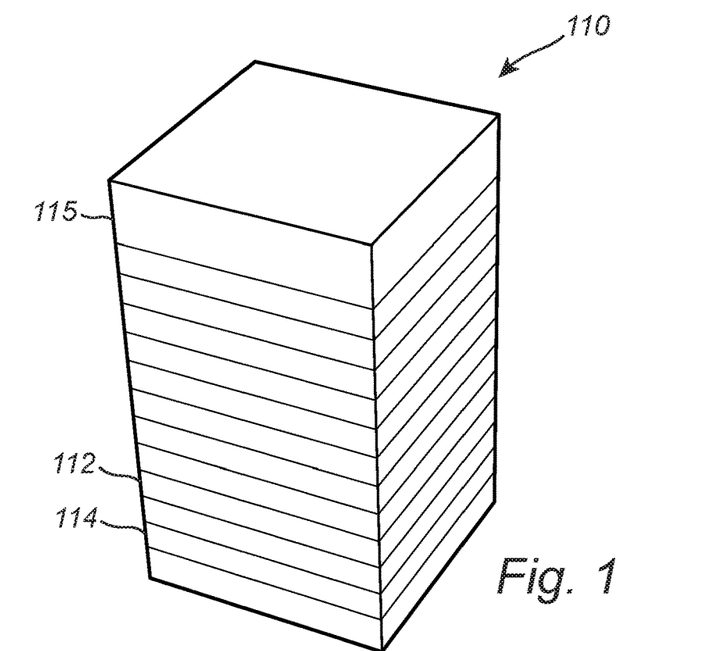
FIGS. 1-20 show, in cross-sectional perspective views, intermediate structures at various stages of fabricating a three-dimensional (3D) semiconductor device according to embodiments of the present disclosure.

FIG. 1 illustrates a first part of a method of manufacturing a plurality of transistor structures arranged in a 3D structure according to an embodiment of the present disclosure. In FIG. 1, a vertical stack 110 of alternating layers of a channel material 112 and a dummy material 114 is provided. Preferably, the channel material 112 and the dummy material 114 are chosen such that a certain etch selectivity can be achieved in the etching processes used for forming the 3D structure. In one example, the channel material 112 may include or be formed of Si and the dummy material 114 may include or be formed of a silicon germanium alloy (SiGe).

Figure 2:
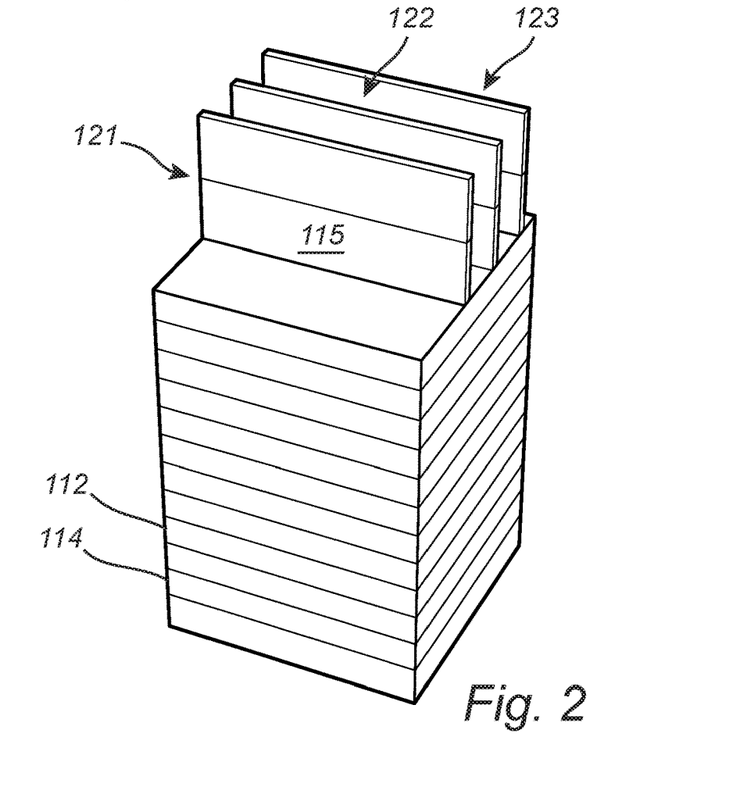

A hardmask material 115 may be arranged on top of the stack 110. The hardmask material 115 may include or be formed of a suitable material, for example a silicon nitride (SiN). As illustrated in FIG. 2, the hardmask material 115 may be patterned into a first set of fins 121, 122, 123. This may for example be done using a multi-patterning scheme such as a self-aligned quadruple patterning (SAQP). In the present example, three parallel fins 121, 122, 123 are formed of the hardmask material. The width of each fins may for example lie in the range of 5 to 10 nm, and the pitch (or separating distance) in the range of 20 to 50 nm.

Figure 3:
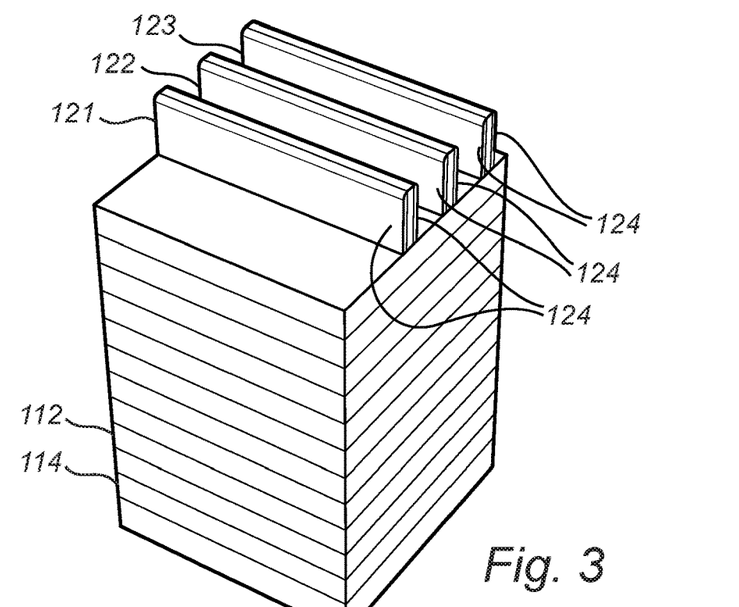

In some embodiments, sidewall spacers 124 may be formed at the lateral sides of the resulting fin structures 121, 122, 123 as illustrated in FIG. 3. The sidewall spacers 124 may be employed later in the processing to forming a temporary offset when forming the spacer structures that isolate the gate contacts from the source/drain contacts. The spacers 124 may include or be formed of a suitable material, for example, a silicon carbon oxide (SiCO).

Figure 4:
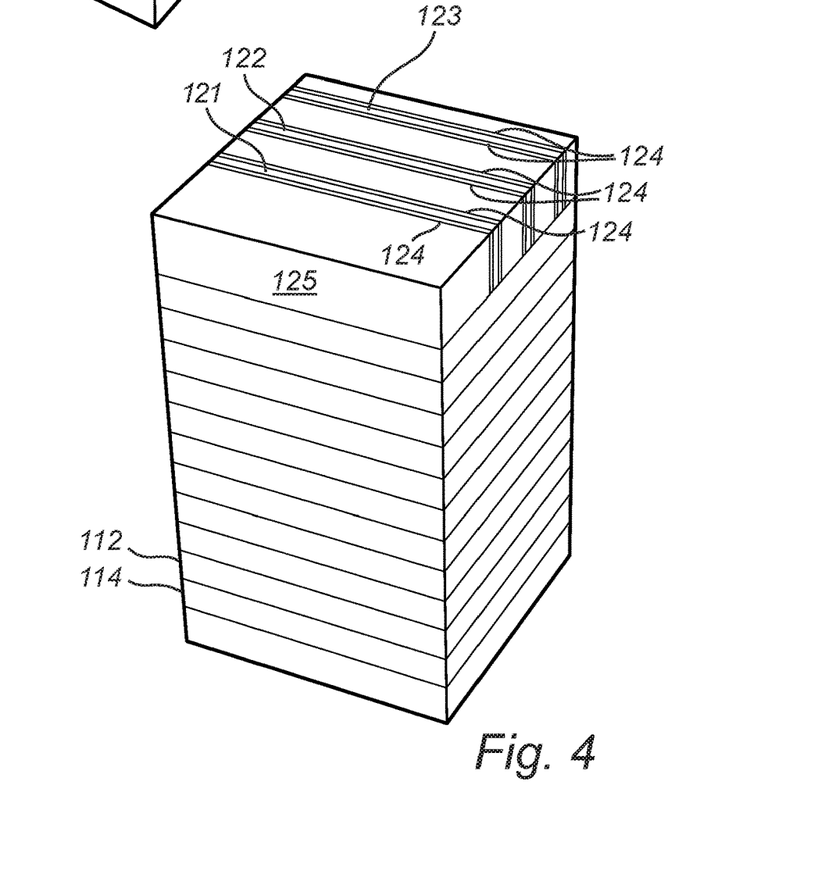

In a subsequent processing step, the space between the sidewall spacers 124 may be filled with a sacrificial material 125, such as a silicon oxide (e.g., SiO$_2$), and planarized. The resulting structure is shown in FIG. 4, in which the first set of fins 121, 122, 123 and the associated sidewall spacers 125 are embedded in the planarized sacrificial material 125 formed of, e.g., SiO$_2$.

Figures 5, 6:
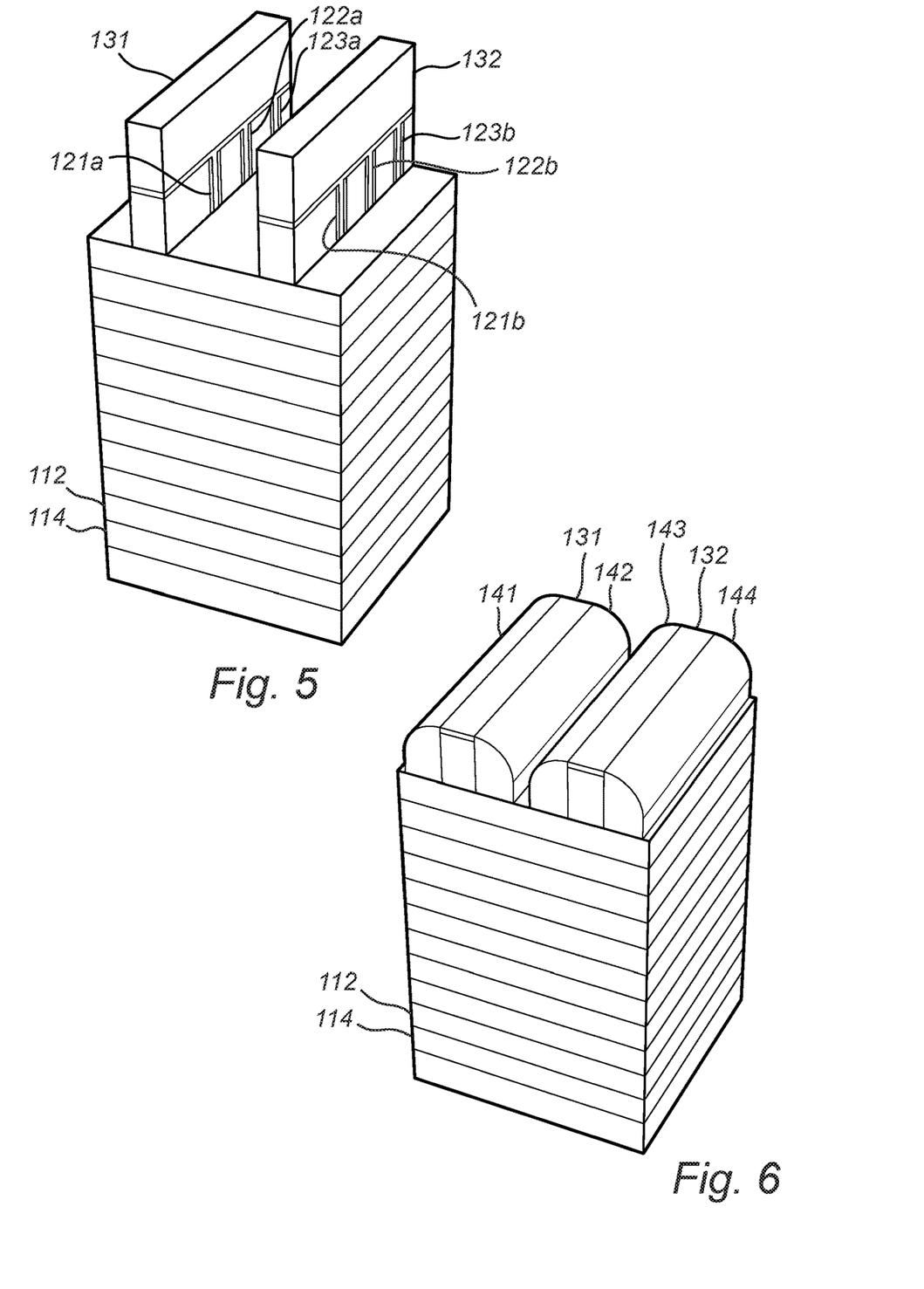

Further, a second fin may be formed on or above the first set of fins 121, 122, 123. In FIG. 5, a pair of fins forming a second set of fins 131, 132 have been provided in an orthogonal direction relative the first set of fins 121, 122, 123 and used as an etch mask to cut the first set of fins 121, 122, 123 into a set of fin portions 121a, 122a, 123a; 121b, 122b, 123b. The width of the second fin 131, 132 may define the final gate length of the resulting transistor structure, and may for example lie in the range of 10 to 30 nm. The pitch, or separation between adjacent fins may define the space for contacts on both sides of the channel region, and may in some examples lie in the range of 50 and 200 nm. The second fin 131, 132 may be formed by means of a multi-patterning process, such as SAQP. The resulting structure can be considered to form a fin-shaped hardmask in which the set of fin portions 121a, 122a, 123a; 121b, 122b, 123b, which is formed of the first set of fins 121, 122, 123, has been etched from into the second set of fins 131, 132.

Figures 7, 8:
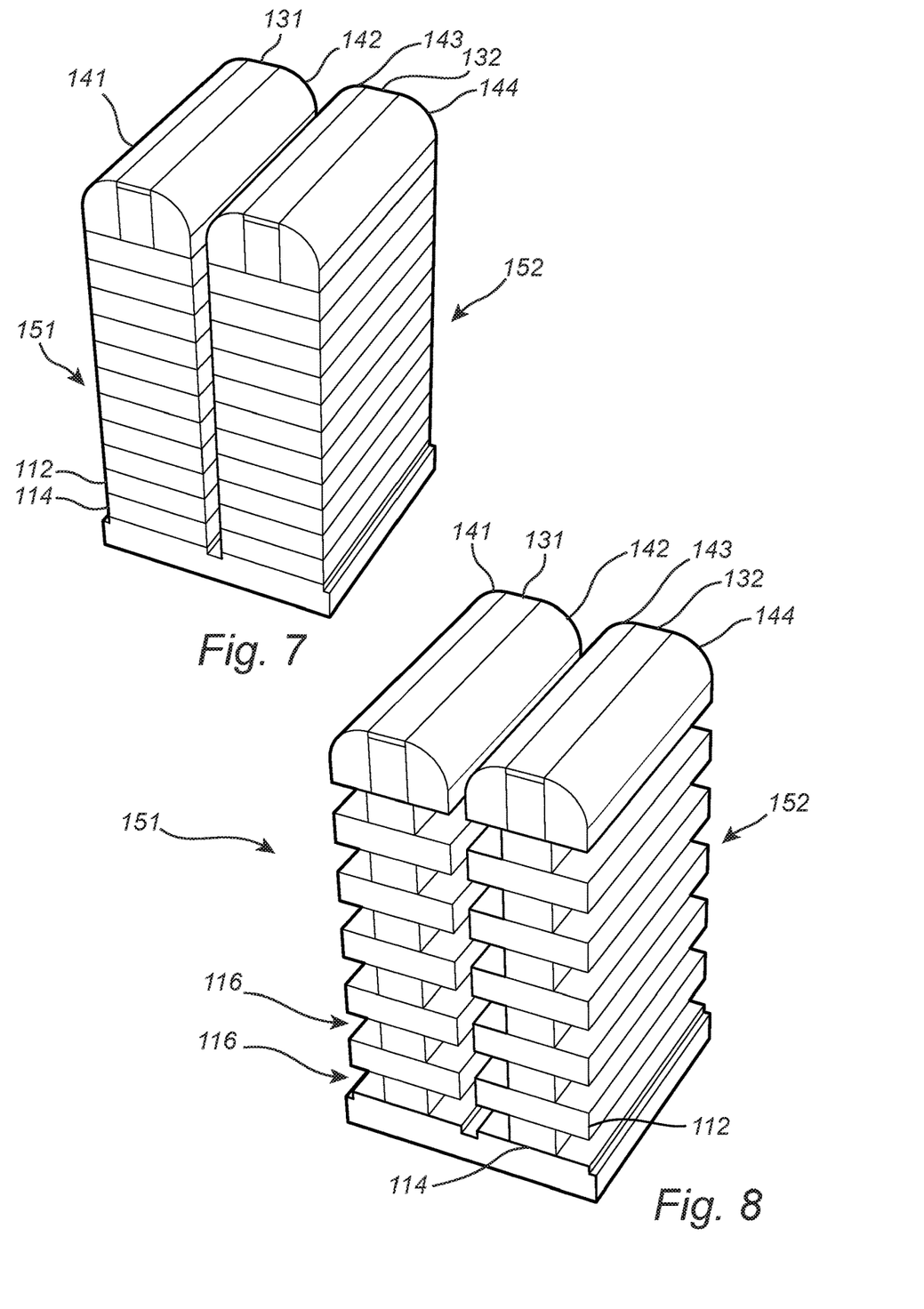

The second set of fins 131, 132 may be provided with sidewall spacers 141, 142, 143, 144 as shown in FIG. 6. The sidewall spacers 141, 142, 143, 144 may be formed so as to define the contact regions of the final transistor structures, and may be used for forming a column of the stack. In the present embodiment, as illustrated in FIG. 7, the sidewall spacers 141, 142, 143, 144 and the second set of fins 131, 132 may be used as an etch mask for etching through the stack 110 to form a first column 151 and a second column 152 of the alternating layers of the channel material 112 and the dummy material 114. The distance between the columns 151, 152 in FIG. 7 is determined by the width and separation of the second set of fins 131, 132, and by the thickness of the sidewall spacers 141, 142, 143, 144. By etching through the stack 110, two individual sets of devices can be formed.

FIG. 8 illustrates the two columns 151, 152 after recessing of the dummy layer 114. The recessing may be performed by lateral recessing of the sides of the columns 151, 152, resulting in cavities or recesses 116 which may have a depth that is slightly smaller than the actual width of the sidewall spacers 141, 142, 143, 144.

Figures 9, 10:
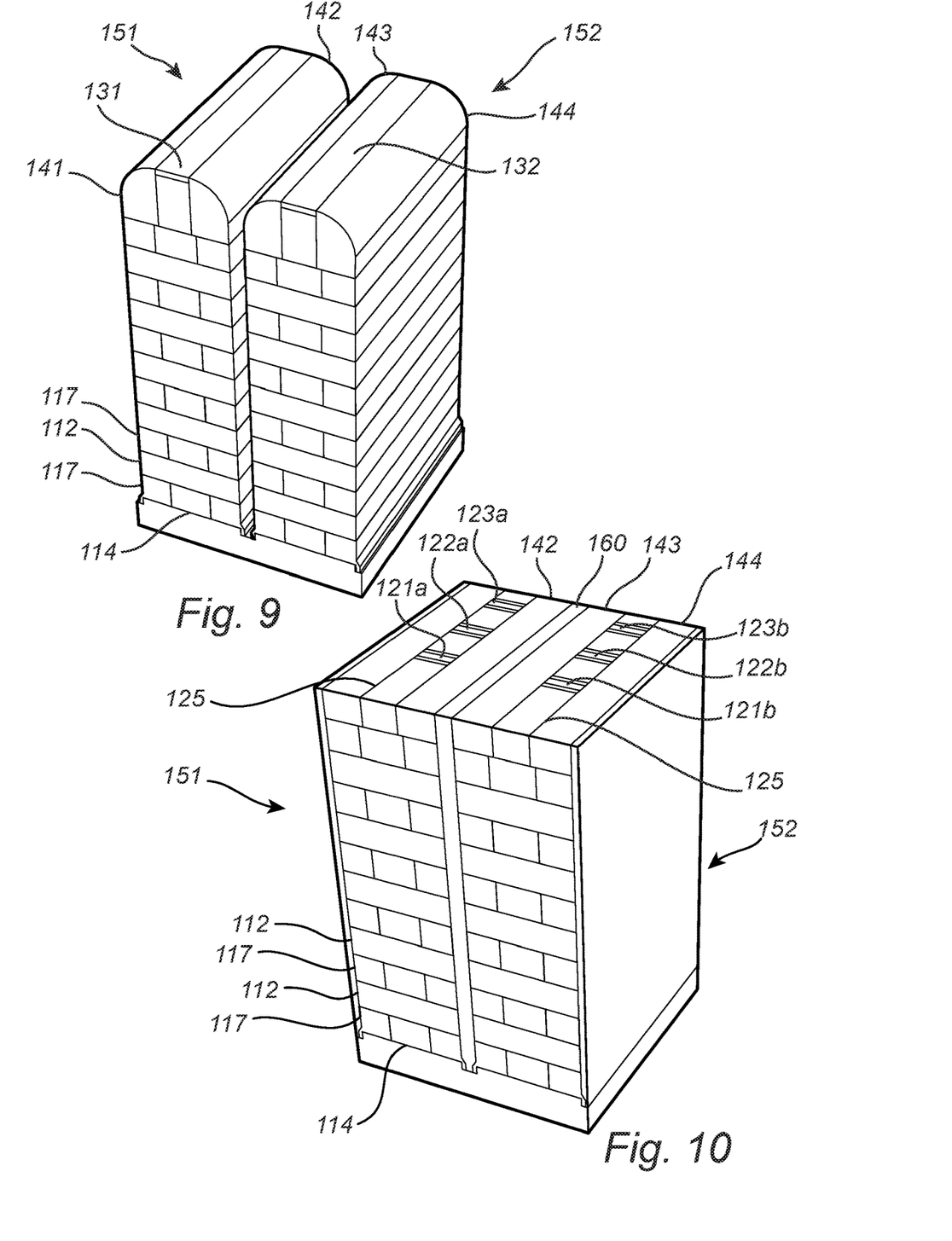

The recesses 116 may be filled with a dielectric material 117, such as SiO$_2$, as shown in FIG. 9. The filling may for example be performed by means of selective deposition or conformal deposition followed by an anisotropic etch that is selective to the material of the sidewall spacers 141, 142, 143, 144.

In FIG. 10, a sacrificial material 160, such as a silicon nitride (SiN), has been formed on the sides of the columns 151, 152 and in the gap in between. Further, the mask formed by the second set of fins 131, 132 and the sidewall spacers 141, 142, 143, 144 has been removed such that the underlying mask formed by the set of fin portions 121a, 121b; 122a, 122b; 123a, 123b of the first set of fins 121, 122, 123, and the associated spacers 124, is exposed.

Figure 11:
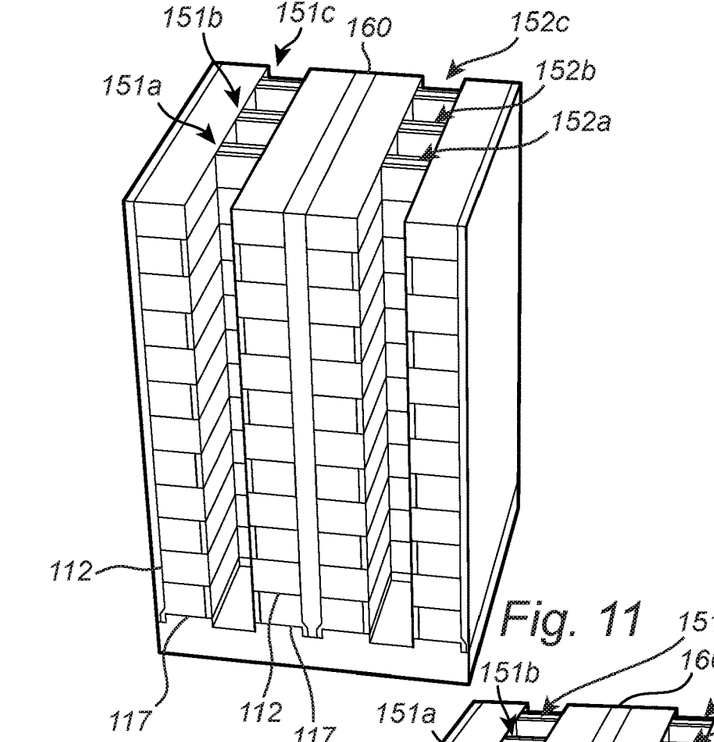

In FIG. 11, this exposed mask can be used for etching through the stack 110 to define the channel regions of the final transistor structures. The channel regions are stacked above each other in vertical sets—in the present example three sets 151a, 151b, 151c in the first column 151 and three sets 152a, 152b, 152c in the second column 152.

Figure 12:
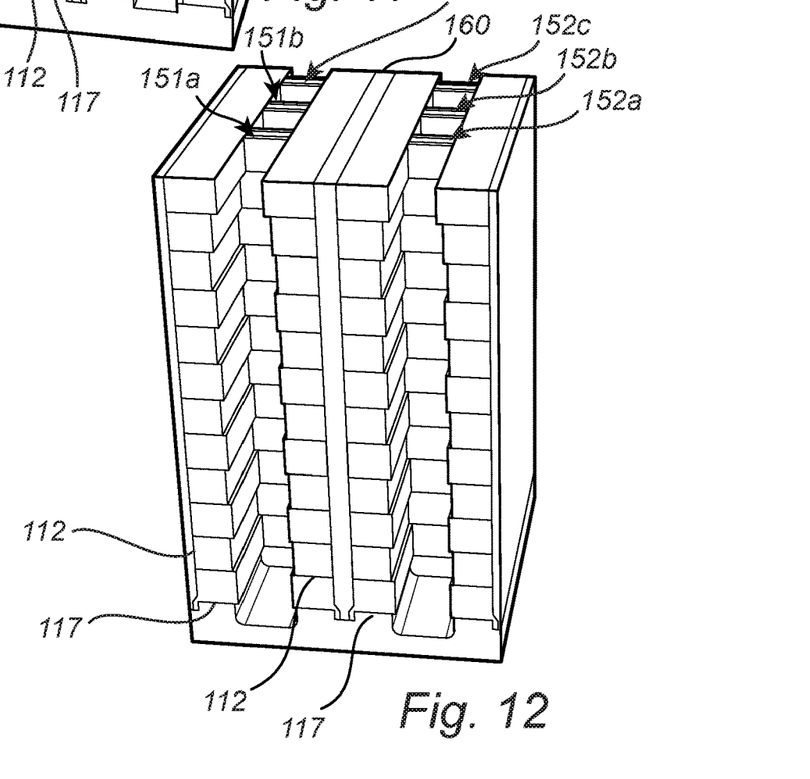

The channel material 112 may be recessed in an isotropic etch process that selectively etches the channel material 112 with respect to the dummy material 114. Preferably, the channel material 112 is recessed by the width of the sidewall spacers 124 to form an isolation distance between the source/drain contacts and the gate of the resulting transistor structure. The recessed structure is illustrated in FIG. 12.

Figures 13, 14:
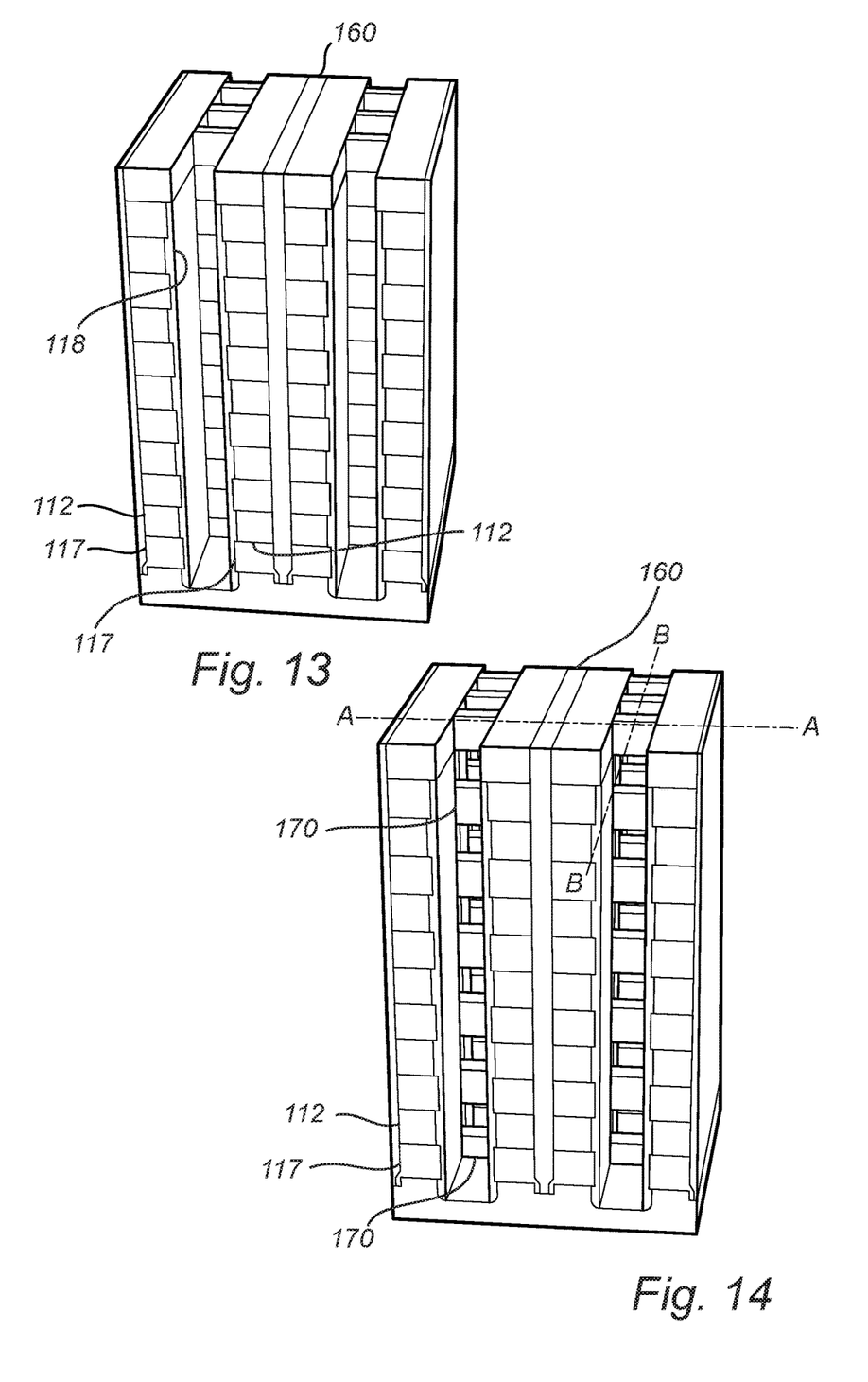

FIG. 13 discloses the 3D structure after formation of an isolating spacer material 118. The isolating spacer material 118 may be provided uniformly in the trenches defining the vertical sets of channel regions, and then removed from the channel material (but not from the source/drain regions). The selective removal of the isolating spacer material 118 from the channel regions may for example be achieved by means of an anisotropic etch process in which the sidewall spacers 124 of the first set of fins 121, 122, 123 are removed, but not the sidewall spacers 141, 142, 143, 144 of the second set of fins 131, 132. Preferably, the isolating spacer material 118 may be of the same type as the material of the sidewall spacers 124 of the first set of fins 131, 132 so they can be etched at the same time. Thus, the sidewall spacers 141, 142, 143, 144 of the second set of fins 131, 132 may, due to the anisotropic character of the etch process, protect the underlying isolating spacer material 118 on the source/drain regions from being removed.

The remaining parts of the dummy layer 114 between the channel regions 151a, 151b, 151c; 152a, 152b, 152c may be removed in a wire release step so as to form the released channel regions 170 shown in FIG. 14.

Figures 15, 16:
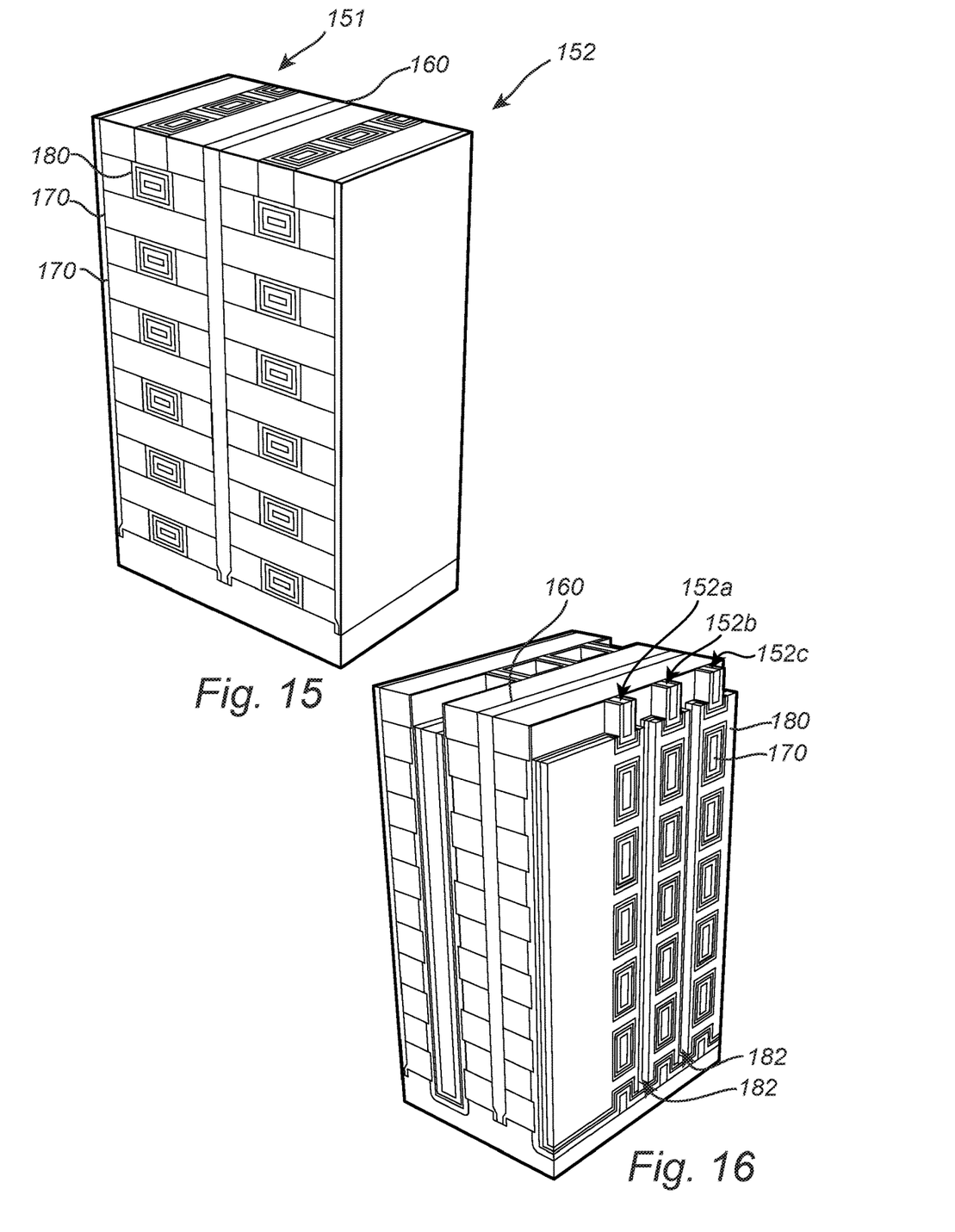

This 3D structure may then be filled with a gate stack 180, which for example may comprise a dielectric material such as a high-k dielectric and a metal material, enclosing the released wires 170. The high-k dielectric material acts as the gate dielectric and the metal material acts as the gate. FIG. 15 is a perspective view similar to the one of FIG. 14, but with a vertical cross section taken along the line A-A' in FIG. 14, i.e., along the channel regions 151a, 152a. As shown in the present figure, each one of the channel regions 151a, 152a extends in a lateral direction of the first and second columns 151, 152 and is stacked above the other channel regions in each set of vertically stacked regions. The section is taken in the plane intersecting the vertical stack and the lateral extension of the channel regions 170, thereby exposing the enclosing nature arrangement of the gate stacks 180.

FIG. 16 is another perspective view similar to the ones in FIGS. 14 and 15, but with a vertical cross section taken across the channel region stacks 152a, 152b, 152c of the second column 152, i.e., along the line B-B' in FIG. 14. This cross section shows the gate stacks 180 enclosing the channel regions 170, in this case forming released wires. FIG. 16 shows the 3D structure after the gate contacts 180 have been separated between the vertical sets of channel regions 152a, 152b, 152c and recessed at the top. This may be achieved by etching separating trench structures 182 between the vertical sets.

Figure 17:
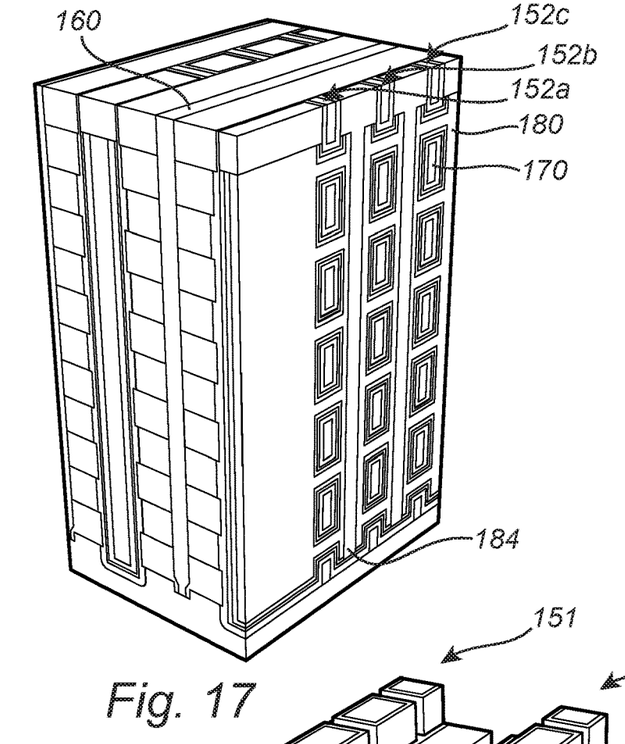

FIG. 17 illustrates the 3D structure of FIG. 16 after the trench structures 182 have been filled with an isolating material 184, such as $SiO_2$. The filling may be followed by a chemical-mechanical polishing (CMP) process to achieve a planar top surface of the 3D structure.

Figure 18:
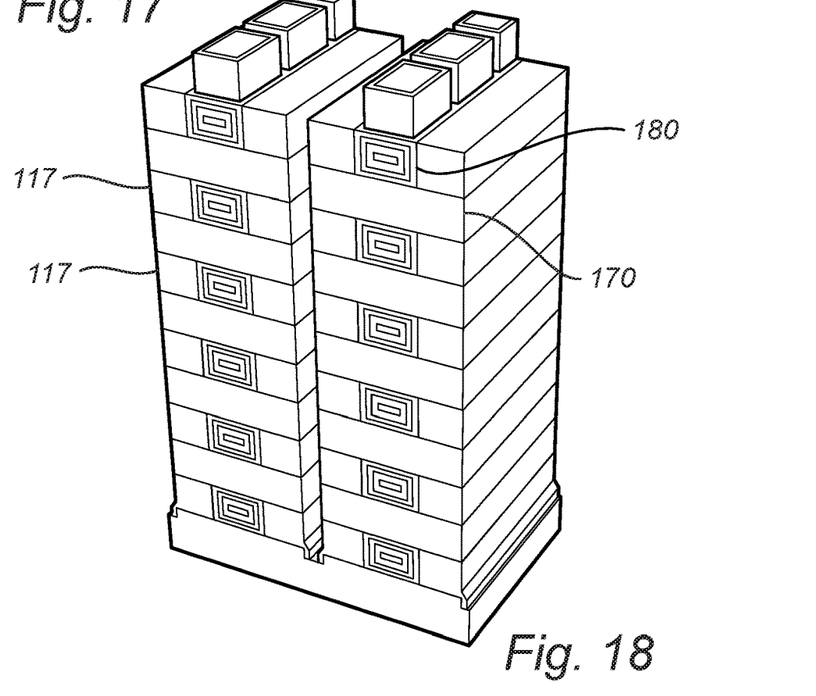

FIG. 18 illustrates a similar view of the 3D structure as in FIG. 15, i.e., a perspective view with a vertical cross section taken along the channel regions 170, line A-A' in FIG. 14. The sacrificial material 160 between the first column 151 and the second column 152 can be etched. Thus, a trench or gap can be formed between the first column 151 and the second column 152.

Figure 19:
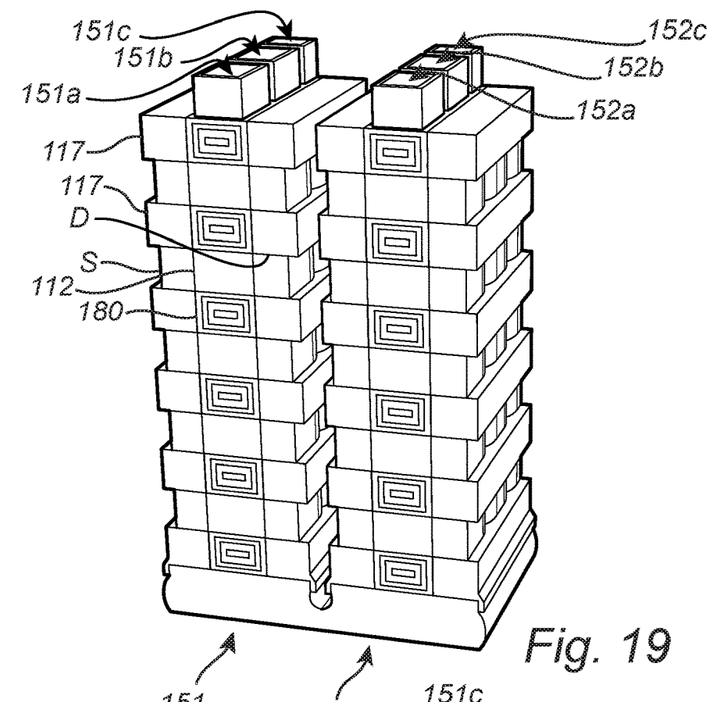

FIG. 19 illustrates a similar view of the 3D structure of FIG. 18, i.e. a perspective view with a vertical cross section taken along the channel regions, line A-A' in FIG. 14. The gap formed between the first column 151 and the second column 152 can be used for accessing the channel region from the lateral side, in the current direction of the channel of the resulting transistor structure. Thus, source regions S and drain regions D may be formed between the dielectric material 117 of the stack, at the end portion of the channel regions or wires 170. The source/drain regions S, D may be for example be formed by plasma implantation or by recessing the channel material 112 and performing an in-situ doped regrowth.

Figure 20:
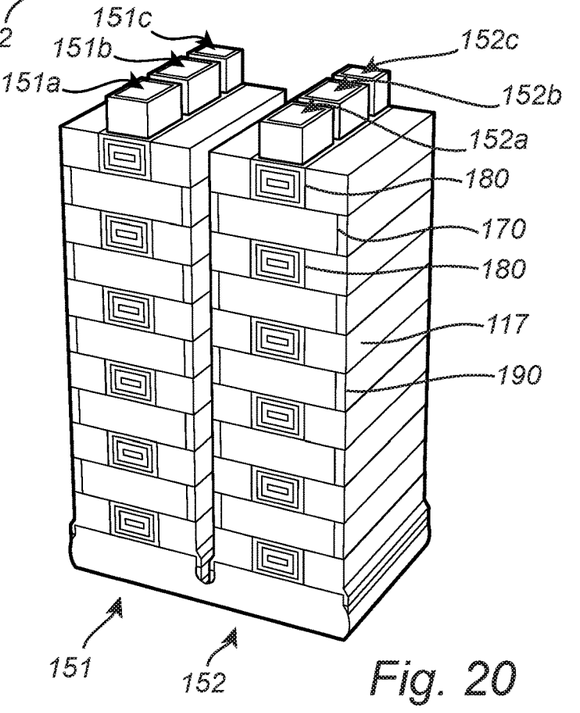

Finally, FIG. 20 illustrates a similar view to that of FIG. 19. FIG. 20 illustrates the final steps to forming the resulting transistors. In this process, the source/drain regions S/D are contacted by a metal layer 190, which for example may be formed by selective deposition or conformal filling followed by an anisotropic selective etch-back process.

The resulting 3D structure, as provided by the present exemplary method, comprises a plurality of transistors arranged in two independent separately addressable columns 151, 152, each of which having three vertical sets of transistors 151a, 151b, 151c; 152a, 152b, 152c. In the present example, transistors arranged in the same vertical set share the gate stacks 180, such that they all can be addressed at the same time via the gate stack 180. Further, all transistors that are arranged on the same vertical level within a column share the same source/drain contacts, such that they all can be addressed at the same time via the source/drain contact 190. In this way, a 3D structure can be provided which allows for each one of the transistors to be individually addressed by selecting the correct intersection between gate and source/drain contacts.

Although reference herein may be made to "drain region"/ "source region", and "drain contact"/"source contact" of a transistor it should be noted that the actual function of the region/contact may depend on the direction of the current flowing through the transistor. Hence, "drain" and "source" should be construed broadly as mere labels for the two different regions/contacts of a transistor. Hence, reference to a "drain" region of a transistor may be interpreted as reference to a "first source/drain" region of the transistor and reference to a "source" region of the transistor may be interpreted as a reference to a "second source/drain region" of the transistor, and correspondingly for "source" contact and "drain" contact.

In the above method in accordance with the present disclosure has mainly been described with reference to a limited number of examples. However, as is readily appreciated by a person skilled in the art, other examples than the ones disclosed above are equally possible within the scope of the inventive concept, as defined by the appended claims. For instance, the above process steps have been recited in a particular order. However, it should be noted that other process sequences are possible without departing from the scope of the claims.

What is claimed is:

1. A method of forming a plurality of three-dimensionally arranged transistor structures, the method comprising:
   providing a vertical stack comprising alternating layers formed of a channel material and a dummy material;
   forming a first set of fins on the stack;
   forming a second fin above the first set of fins, the second fin extending orthogonal to the first set of fins;
   cutting the first set of fins into a set of fin portions, using the second fin as an etch mask;
   forming sidewall spacers on the second fin;
   forming a column comprising the stack by etching using the second fin and the sidewall spacers as an etch mask;
   etching through the stack of alternating layers by using the set of fin portions, a sacrificial material, the second fin and the sidewall spacers as an etch mask, wherein each fin portion defines a vertical set of channel regions in the column, and wherein the sidewall spacers define source regions and/or drain regions associated with the channel regions; and
   removing the dummy material between the channel regions of the vertical set of channel regions, thereby forming wires suspended between respective source and drain regions.

2. The method of claim 1, wherein:
   the second fin forms part of a second set of fins each having sidewall spacers formed thereon; and
   the second set of fins and corresponding sidewall spacers are used as an etch mask for forming a plurality of columns.

3. The method of claim 1, wherein forming the first set of fins further comprises:
   forming sidewall spacers on each fin of the first set of fins;
   filling a space between the sidewall spacers on adjacent fins of the first set of fins with the sacrificial material; and
   planarizing the first set of fins, the sidewall spacers on the first set of fins and the sacrificial material prior to forming the second fin.

4. The method of claim 1, wherein forming the column is followed by:
   forming lateral recesses by partly removing the dummy material of the vertical stack; and
   forming a dielectric material in the lateral recesses.

5. The method of claim 3, wherein etching through the stack of alternating layers is followed by:
   forming lateral recesses in the channel material;
   forming an isolating spacer material in the recesses; and removing the isolating spacer material from the channel regions, using the sidewall spacers on the second fin as an etch mask.

6. The method of claim 5, wherein removing the isolating spacer material from the channel regions comprises selectively removing the sidewall spacers on the first set of fins and the isolating spacer material in the channel region.

7. The method of claim 5, wherein the channel material is recessed by a depth corresponding to the width of the sidewall spacers on the first set of fins.

8. The method of claim 5, wherein the isolating spacer material is the same as the material of the sidewall spacers on the first set of fins.

9. The method of claim 2, wherein the material of the sidewall spacers on the first set of fins is etch selective with respect to the material of the sidewall spacers on the second fin.

10. The method of claim 1, further comprising:
forming a gate stack around each of the wires.

11. The method of claim 10, wherein the gate stack comprises a dielectric layer and a metal layer.

12. The method of claim 11, wherein the dielectric layer comprises a high-k dielectric layer.

13. The method of claim 11, wherein the dielectric serves as a gate dielectric layer of a transistor and the metal layer serves as a gate electrode of the transistor.

14. The method of claim 1, wherein the channel material is formed of Si and wherein the dummy material is formed of a silicon germanium alloy.

15. The method of claim 3, wherein:
the first set of fins is formed of a silicon nitride;
the sidewall spacers on the first set of tins are formed of a silicon carbon oxide; and
the sacrificial material between sidewall spacers on adjacent fins of the first set of fins comprises a silicon oxide.

* * * * *

UNITED STATES PATENT AND TRADEMARK OFFICE
CERTIFICATE OF CORRECTION

PATENT NO. : 10,748,815 B2
APPLICATION NO. : 16/663796
DATED : August 18, 2020
INVENTOR(S) : Juergen Boemmels et al.

Page 1 of 1

It is certified that error appears in the above-identified patent and that said Letters Patent is hereby corrected as shown below:

In the Claims

In Column 9, Line 10, Claim 7, delete "the" and insert --a--.

In Column 10, Line 15, Claim 15, delete "tins" and insert --fins--.

Signed and Sealed this
Twenty-fourth Day of November, 2020

Andrei Iancu
*Director of the United States Patent and Trademark Office*